United States Patent
Setz et al.

(10) Patent No.: US 9,945,989 B2
(45) Date of Patent: Apr. 17, 2018

(54) PROCESS FOR PRODUCING A SCATTERING LAYER FOR ELECTROMAGNETIC RADIATION AND SCATTERING LAYER FOR SCATTERING ELECTROMAGNETIC RADIATION

(71) Applicant: OSRAM Opto Semiconductors GmbH, Regensburg (DE)

(72) Inventors: Daniel Steffen Setz, Boeblingen (DE); Manfred Deisenhofer, Altenmünster (DE); Angela Eberhardt, Augsburg (DE); Christina Wille, Friedberg (DE)

(73) Assignee: OSRAM OLED GmbH, Regensburg (DE)

( * ) Notice: Subject to any disclaimer, the term of this patent is extended or adjusted under 35 U.S.C. 154(b) by 457 days.

(21) Appl. No.: 14/396,801

(22) PCT Filed: Apr. 11, 2013

(86) PCT No.: PCT/EP2013/057633
§ 371 (c)(1),
(2) Date: Oct. 24, 2014

(87) PCT Pub. No.: WO2013/160120
PCT Pub. Date: Oct. 31, 2013

(65) Prior Publication Data
US 2015/0097166 A1    Apr. 9, 2015

(30) Foreign Application Priority Data
Apr. 26, 2012 (DE) .................. 10 2012 206 955

(51) Int. Cl.
*G02B 5/02* (2006.01)
*C03C 17/04* (2006.01)
(Continued)

(52) U.S. Cl.
CPC .............. *G02B 5/0226* (2013.01); *C03C 8/10* (2013.01); *C03C 8/14* (2013.01); *C03C 8/22* (2013.01);
(Continued)

(58) Field of Classification Search
None
See application file for complete search history.

(56) References Cited

U.S. PATENT DOCUMENTS

| 8,018,140 B2 | 9/2011 | Nakamura et al. |
| 8,368,064 B2 | 2/2013 | Wada et al. |

(Continued)

FOREIGN PATENT DOCUMENTS

| CN | 1735970 A | 2/2006 |
| CN | 101766052 A | 6/2010 |

(Continued)

OTHER PUBLICATIONS

Japanese Office Action based on application No. 2015-507458 (3 pages and 3 pages of English translation) dated Nov. 24, 2015 (Reference Purpose Only).

(Continued)

*Primary Examiner* — James Mellott
(74) *Attorney, Agent, or Firm* — Viering, Jentschura & Partner mbB

(57) ABSTRACT

Various embodiments may relate to a process for producing a scattering layer for electromagnetic radiation. The process may include applying scattering centers onto a carrier, applying glass onto the scattering centers, and liquefying of the glass so that a part of the liquefied glass flows between the scattering centers toward the surface of the carrier, in such a way that a part of the liquefied glass still remains above the scattering centers.

17 Claims, 4 Drawing Sheets

(51) Int. Cl.
    *C03C 8/10*         (2006.01)
    *C03C 8/14*         (2006.01)
    *C03C 8/22*         (2006.01)
    *H01L 51/52*       (2006.01)
    *H01L 51/56*       (2006.01)

(52) U.S. Cl.
    CPC ............ *C03C 17/04* (2013.01); *G02B 5/0242* (2013.01); *G02B 5/0268* (2013.01); *G02B 5/0278* (2013.01); *H01L 51/5268* (2013.01); *H01L 51/56* (2013.01)

(56) References Cited

U.S. PATENT DOCUMENTS

| | | |
|---|---|---|
| 8,525,403 B2 | 9/2013 | Aoki et al. |
| 8,729,593 B2 | 5/2014 | Nakamura et al. |
| 2007/0257608 A1* | 11/2007 | Tyan .................... C03C 17/38 313/506 |
| 2009/0153972 A1 | 6/2009 | Nakamura et al. |
| 2010/0187987 A1 | 7/2010 | Nakamura |
| 2010/0230667 A1 | 9/2010 | Nakamura et al. |
| 2011/0001159 A1 | 1/2011 | Nakamura et al. |
| 2011/0287264 A1* | 11/2011 | Wada .................... C03C 3/16 428/428 |
| 2012/0194064 A1 | 8/2012 | Wada et al. |
| 2013/0114269 A1 | 5/2013 | Domercq et al. |
| 2013/0221336 A1 | 8/2013 | Allano et al. |

FOREIGN PATENT DOCUMENTS

| | | |
|---|---|---|
| CN | 101978781 A | 2/2011 |
| EP | 2178343 A1 | 4/2010 |
| EP | 2278852 A1 | 1/2011 |
| JP | 11194204 A | 7/1999 |
| JP | 2008503064 A | 1/2008 |
| JP | 2013539158 A | 10/2013 |
| WO | 0237580 A1 | 5/2002 |
| WO | 0237658 A1 | 5/2002 |
| WO | 2005124887 A2 | 12/2005 |
| WO | 2009017035 A1 | 2/2009 |
| WO | 2009060916 A1 | 5/2009 |
| WO | 2009116531 A1 | 9/2009 |
| WO | 2010084922 A1 | 7/2010 |
| WO | 2010084923 A1 | 7/2010 |
| WO | 2011046156 A1 | 4/2011 |
| WO | 2011046190 A1 | 4/2011 |
| WO | 2012007575 A1 | 1/2012 |
| WO | 2012017183 A1 | 2/2012 |
| WO | 2012069519 A2 | 5/2012 |

OTHER PUBLICATIONS

Chinese Office Action based on Application No. 201380022264.0(6 Pages and 5 pages of English translation) dated Jan. 25, 2016 (Reference Purpose Only).
International Searhc Report of PCT/EP2013/057633 dated Sep. 23, 2013.
Japanese Decision to Grant based on application No. 2015-507458 (2 pages) dated Mar. 13, 2017 (Reference Purpose Only).

* cited by examiner

PROCESS FOR PRODUCING A SCATTERING LAYER FOR ELECTROMAGNETIC RADIATION AND SCATTERING LAYER FOR SCATTERING ELECTROMAGNETIC RADIATION

RELATED APPLICATIONS

The present application is a national stage entry according to 35 U.S.C. § 371 of PCT application No.: PCT/EP2013/057633 filed on Apr. 11, 2013, which claims priority from German application No.: 10 2012 206 955.0 filed on Apr. 26, 2012, and is incorporated herein by reference in its entirety.

TECHNICAL FIELD

In various embodiments, a method for producing a scattering layer for electromagnetic radiation, and a scattering layer for scattering electromagnetic radiation, are provided.

BACKGROUND

An organic light-emitting diode (OLED) on a carrier includes an organic functional layer structure between a first electrode and a second electrode, in which case the first electrode is in contact with the carrier and an encapsulation layer may be deposited on or over the second electrode. A flow of current between the electrodes leads to the generation of electromagnetic radiation in the organic functional layer system. Without technical assistance, normally only ~20% of the electromagnetic radiation can be extracted from the OLED by means of total internal reflection inside the component.

The total internal reflection in the OLED can be reduced by the use of scattering layers, for example with a scattering layer between the first electrode and the carrier. In this way, a larger proportion of the electromagnetic radiation generated, for example light, can be extracted.

In a conventional scattering layer, an organic matrix is used in which scattering centers with a different refractive index are embedded (WO 02/37580 A1). Upon contact with water and/or oxygen, however, organic scattering layers can age or degrade and thus reduce the stability of an OLED. Another disadvantage of organic scattering layers is their low refractive index (n~1.475). Since the organic functional layer structure usually has a refractive index of approximately 1.7, the low refractive index of the organic scattering layers entails moderate angles of incidence for the criterion of total internal reflection at the interface of the first electrode with the scattering layer.

Furthermore, scattering layers made of high-index glass solder with embedded scattering centers are conventional. The number density of the scattering centers conventionally decreases from the inside outward (EP 2 178 343 A1, US 2010/0187987 A1, WO 2011/046190 A1) or is homogeneous in the layer cross section. This layer cross section results from the conventional method for producing the layers, which are formed from a suspension, or a paste, of scattering centers and matrix substance, for example glass solder. The roughness of the scattering layer, or the shape of the scattering centers, may however lead to the formation of spikes on the scattering layer surface. When using scattering particles as scattering centers, scattering particles not fully enclosed by glass on the scattering layer surface may likewise form spikes. Spikes are to be understood as local surface roughenings with a high aspect ratio. Particularly in the case of a thin configuration of an OLED, spikes can lead to short circuiting of the first electrode with the second electrode. Furthermore, local distortion or decomposition of the layers on or over the scattering layer, for example the first electrode or the organically functional layer, may occur in the immediate vicinity of the spikes of the scattering layer during production of the OLED. If a thin-film encapsulation is applied on the component, then the spikes entail the risk that the thin-film encapsulation will not be locally dense, which can lead to degradation of the component.

The surface properties, for example a low surface roughness or a defined waviness, are conventionally adjusted by means of an additionally applied glass layer (EP 2 278 852 A1, WO 2010/084922, WO 2010/084923). This also reduces the risk that scattering particles not fully enclosed by glass will be present on the scattering layer surface. However, the additional layer usually requires an additional heat-treatment step and therefore lengthens the processing.

SUMMARY

In various embodiments, a method is provided with which it is possible to produce scattering layers having an adjustable scattering cross section and a smooth surface with a single heat-treatment step.

In the scope of this description, an organic substance may be understood as a compound of carbon existing in chemically uniform form and distinguished by characteristic physical and chemical properties, regardless of the respective aggregate state. Furthermore, in the scope of this description, an inorganic substance may be understood as a compound without carbon, or a simple carbon compound, existing in chemically uniform form and distinguished by characteristic physical and chemical properties, regardless of the respective aggregate state. In the scope of this description, an organic-inorganic substance (hybrid substance) may be understood as a compound including compound parts which contain carbon and compound parts which are free of carbon, existing in chemically uniform form and distinguished by characteristic physical and chemical properties, regardless of the respective aggregate state. In the scope of this description, the term "substance" includes all substances mentioned above, for example an organic substance, an inorganic substance and/or a hybrid substance. Furthermore, in the scope of this description, a substance mixture may be understood as something that consists of constituents of two or more different substances, the constituents of which are for example very finely distributed. A substance class is to be understood as a substance or a substance mixture consisting of one or more organic substances, one or more inorganic substances or one or more hybrid substances. The term "material" may be used synonymously with the term "substance".

In various embodiments, a method for producing a scattering layer for electromagnetic radiation is provided, wherein the method includes application of scattering centers onto a carrier; application of glass onto the scattering centers and liquefying of the glass so that a part of the liquefied glass flows between the scattering centers toward the surface of the carrier, in such a way that a part of the liquefied glass still remains above the scattering centers.

The part of the scattering layer above the scattering centers should have a thickness equal to or greater than the roughness of the uppermost layer of the scattering centers without glass, so that at least one smooth surface is formed, i.e. the surface has a low rms (root mean square) roughness, for example less than 10 nm. The roughness of the uppermost layer of the scattering centers depends on the actual size of the scattering centers, i.e. not only the average particle size and the scattering center concentration in the plane parallel to the carrier.

The liquefying of the glass after the application of the scattering centers is essential for the method. In this way, the distribution of the scattering centers in the scattering layer may be adjusted and a smooth surface of the scattering layer may be formed in a single process of liquefying the glass, for example a heat-treatment process. The production of a suspension or paste of glass particles, or with a glass powder, is not to be regarded as liquefying in this sense, since the form of the glass particles is not modified by the suspension.

In one configuration of the method, the carrier may include a glass, for example a soft glass, for example soda-lime glass.

In another configuration of the method, the carrier may be formed so as to be mechanically flexible.

In another configuration of the method, the carrier may be formed so as to be flat.

In another configuration of the method, the scattering centers may include a substance or a substance mixture, or be formed therefrom, from the group of substances: inorganic substances.

The scattering centers may include an inorganic substance or an inorganic substance mixture, or be formed therefrom, for example particles of $TiO_2$, $CeO_2$, $Bi_2O_3$, $Y_2O_3$, $ZrO_2$, $SiO_2$, $Al_2O_3$, $ZnO$, $SnO_2$, or phosphors. The scattering centers may, however, also be formed as glass particles which have a different refractive index than the glass matrix and are higher-softening, i.e. they have a higher softening temperature, than the glass matrix.

In another configuration, when phosphors are used as scattering centers, the scattering layer may simultaneously be formed for wavelength conversion of electromagnetic radiation. The phosphors may in this case have a Stokes shift and emit incident electromagnetic radiation with a longer wavelength.

In another configuration of the method, the scattering centers may have a curved surface.

The geometrical shape of the scattering centers may be arbitrary, for example being formed so as to be spherical, aspherical, for example prismatic, ellipsoid, and hollow or compact.

In another configuration of the method, the scattering centers may have an average particle size of from approximately 0.1 μm to approximately 3 μm.

In another configuration of the method, a plurality of layers of scattering centers (even very different scattering centers) may be applied on top of one another on the support.

In another configuration of the method, the individual layers of the scattering centers include scattering centers with different average particle sizes.

In another configuration of the method, the average particle size of the scattering centers may decrease in the direction away from the surface of the carrier.

In another configuration of the method, the scattering centers applied on the carrier may form a layer with a thickness of from approximately 0.1 μm to approximately 10 μm.

In another configuration of the method, the glass on the scattering centers may have of a substance or substance mixture with a refractive index greater than or approximately equal to the refractive index of further layers in the layer cross section. In this way, incident electromagnetic radiation may not be totally internally reflected at the interfaces of the scattering layer at any angle of incidence. This is advantageous for the output of electromagnetic radiation from the component.

In another configuration of the method, the scattering layer may have a difference greater than approximately 0.05 between the refractive index of the scattering centers and the refractive index of the glass after solidification of the glass.

In another configuration of the method, a carrier made of soda-lime glass is used in combination with a glass powder which may be vitrified at temperatures of up to at most 600° C., which means that the glass powder softens to such an extent that it runs smoothly.

In another configuration of the method, the glass may be formed as glass powder and vitrified at a temperature of up to at most approximately 600° C., i.e. the glass powder softens in such a way that it may form a smooth surface. The substance or the substance mixture of the carrier, for example soda-lime glass, should be thermally stable at the glass transition temperature of the glass powder, i.e. it should have an unvarying layer cross section.

In another configuration of the method, the glass may include a glass solder, or be formed therefrom, from the group of glass systems:
for example systems containing PbO:
$PbO$—$B_2O_3$,
$PbO$—$SiO_2$,
$PbO$—$B_2O_3$—$SiO_2$,
$PbO$—$B_2O_3$—$ZnO_2$,
$PbO$—$B_2O_3$—$Al_2O_3$,
in which case the glass solder containing PbO may also include $Bi_2O_3$;
or lead-free glass systems:
for example systems containing $Bi_2O_3$:
$Bi_2O_3$—$B_2O_3$,
$Bi_2O_3$—$B_2O_3$—$SiO_2$,
$Bi_2O_3$—$B_2O_3$—$ZnO$,
$Bi_2O_3$—$B_2O_3$—$ZnO$—$SiO_2$.

The systems containing $Bi_2O_3$ may also include further glass components, for example $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, and rare earth oxides.

In another configuration of the method, the scattering layer may be applied on the carrier with a thickness of from approximately 0.1 μm to approximately 40 μm, for example with a thickness of from approximately 10 μm to 30 μm.

In another configuration of the method, the scattering centers may be applied on or over the carrier from a scattering center suspension or paste.

Methods for producing layers from suspensions or pastes may, for example, be screen printing, template printing, doctor blading or spraying methods.

In another configuration of the method, besides the scattering centers, the scattering center suspension or paste may include liquid evaporating and/or organic constituents. These constituents may be various so-called additives, for example solvents, binders, for example cellulose, cellulose derivatives, nitrocellulose, cellulose acetate, acrylates, and may be added to the scattering centers or glass particles in order to adjust the viscosity for the respective method and for the respectively desired layer thickness.

Organic additives, which may usually be liquid and/or volatile, may be thermally removed from the layer, i.e. the layer may be thermally dried. Nonvolatile organic additives may be removed by means of pyrolysis. An increase in the temperature may in this case accelerate the drying or pyrolysis, or make it possible.

In another configuration of the method, the scattering center suspension or paste on or over the carrier may be dried by means of constituents that evaporate.

In another configuration of the method, the glass may be applied in particles as glass powder onto the scattering centers.

In another configuration of the method, the glass particles may be applied in a suspension or paste onto the scattering centers.

In another configuration of the method, the glass particles may have a diameter of from approximately 0.1 µm to approximately 30 µm.

In another configuration of the method, besides the glass particles or glass powder, the glass particle suspension or glass particle paste may include liquid evaporating and/or organic components, for example binders.

In another configuration of the method, the glass particle suspension or glass particle paste, and the scattering center suspension or scattering center paste, may include liquid evaporating and/organic components which are miscible with one another. In this way, phase separation or precipitation of additives within the dried scattering center suspension or scattering center paste, or dried glass layer suspension or scattering center paste, may be prevented.

In another configuration of the method, the glass particle suspension or scattering center paste on or over the scattering centers may be dried by means of constituents that evaporate.

In another configuration of the method, the organic constituents (binders) may be removed from the dried scattering center layer, and from the dried glass powder layer, essentially fully by raising the temperature.

In another configuration of the method, the glass or glass powder may be softened in such a way that it may flow, for example become liquid, by raising the temperature to a second value, the second temperature being very much higher than the first temperature for the drying.

The maximum amount of the second temperature value for the liquefying or vitrifying of the glass powder layer may be dependent on the carrier. The temperature regime (temperature and time) may be selected in such a way that the carrier is not deformed, but the glass solder of the glass powder layer already has a viscosity such that it may run smoothly, i.e. flow, and may form a very smooth vitreous surface.

The glass of the glass powder layer may have a second temperature, i.e. the glass transition temperature, for example below the transformation point of the carrier, for example the carrier glass, (viscosity of the carrier $\eta=10^{14.5}$ dPa·s) and of most at the softening temperature (viscosity of the carrier $\eta=10^{7.6}$ dPa·s) of the carrier glass, for example below the softening temperature and approximately at the upper cooling point (viscosity of the carrier $\eta=10^{13.0}$ dPa·s).

In another configuration of the method, when a soda-lime glass is used as the carrier, the glass powder may be vitrified at temperatures of up to at most approximately 600° C.

In another configuration of the method the glass on or over the scattering centers may have of a substance or substance mixture having a refractive index greater than or approximately equal to the layer thickness-weighted refractive index of further layers in the layer cross section.

A layer thickness-weighted refractive index is an average refractive index weighted with the respective layer thickness proportions.

In another configuration of the method, at least one continuous glass connection without gaps of the carrier to the liquefied glass above the scattering centers may be formed by means of liquefied glass between the scattering centers.

In another configuration of the method, the carrier may include a soda-lime glass or be formed therefrom, in which case the temperature for vitrifying the glass powder, or the glass powder layer, should at most have a value of approximately 600° C.

In another configuration of the method, the surface of the liquefied glass above the scattering centers may be additionally smoothed once more after solidification by means of local heating.

In another configuration of the method, the local heating may be formed by means of plasma or laser radiation.

In another configuration of the method, the scattering layer may be formed as part of the layer cross section of an organic light-emitting diode.

In various embodiments, an optical component is provided, the optical component including: a carrier, for example a soft glass, and a scattering layer, wherein the scattering layer includes: a matrix and, embedded therein, at least a first type of optical scattering centers with a higher refractive index than the matrix or a lower refractive index than the matrix; wherein the interface of the carrier with the scattering layer has a concentration of the matrix greater than 0% by volume; the surface of the scattering layer has a concentration of the matrix of 100% by volume; the matrix of the scattering layer has at least one continuous connection without gaps from the surface of the carrier to the surface of the scattering layer; and the concentration by volume of at least one type of scattering centers decreases from the surface of the carrier.

In one configuration, the difference between the refractive index of the matrix and the refractive index of the scattering centers may be at least approximately 0.05.

In another configuration, the matrix may have a refractive index greater than approximately 1.5.

In another configuration, the matrix may be formed so as to be amorphous.

In another configuration, the matrix may include a glass solder or be formed therefrom, having a substance or a substance mixture from the glass systems:
for example systems containing PbO:
$PbO-B_2O_3$,
$PbO-SiO_2$,
$PbO-B_2O_3-SiO_2$,
$PbO-B_2O_3-ZnO_2$,
$PbO-B_2O_3-Al_2O_3$,
in which case the glass solder containing PbO may also include $Bi_2O_3$;
or lead-free glass systems: for example systems containing $Bi_2O_3$:
$Bi_2O_3-B_2O_3$,
$Bi_2O_3-B_2O_3-SiO_2$,
$Bi_2O_3-B_2O_3-ZnO$,
$Bi_2O_3-B_2O_3-ZnO-SiO_2$.

The systems containing $Bi_2O_3$ may also include further glass components, for example $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, and rare earth oxides.

In another configuration, a first type of scattering centers may include as cavities in the matrix and/or a substance or substance mixture or a stoichiometric compound, or be formed therefrom, from the group of substances: $TiO_2$, $CeO_2$, $Bi_2O_3$, $Y_2O_3$, $ZrO_2$, $SiO_2$, $Al_2O_3$, $ZnO$, $SnO_2$, or phosphors or glass particles, which have a different refractive index than the glass matrix and are higher-softening than the glass matrix, or even metallic nanoparticles.

In another configuration, the average particle size of the first scattering centers may decrease in the direction away from the surface of the carrier.

In another configuration, the scattering layer may have a thickness of from at least 1 µm to approximately 100 µm, preferably 10-30 µm.

In another configuration, the scattering layer may be produced as a layer in a light-emitting diode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference will be made to the appended drawings, which are part of this description and in which specific embodiments in which the disclosure may be implemented are shown for illustration. In this regard, direction terminology such as "up", "down", "forward", "backward", "front", "rear", etc. is used with reference to the orientation of the figure or figures being described. Since components of embodiments can be positioned in a number of different orientations, the direction terminology is used for illustration and is in no way restrictive. It is to be understood that other embodiments may be used and structural or logical modifications may be carried out, without departing from the protective scope of the present disclosure. It is to be understood that the features of the various embodiments described herein may be combined with one another, unless specifically indicated otherwise. The following detailed description is therefore not to be interpreted in a restrictive sense, and the protective scope of the present disclosure is defined by the appended claims.

In the scope of this description, terms such as "connected" or "coupled" are used to describe both direct and indirect connection, and direct or indirect coupling. In the figures, elements which are identical or similar are provided with identical references, insofar as this is expedient.

Figure 1:
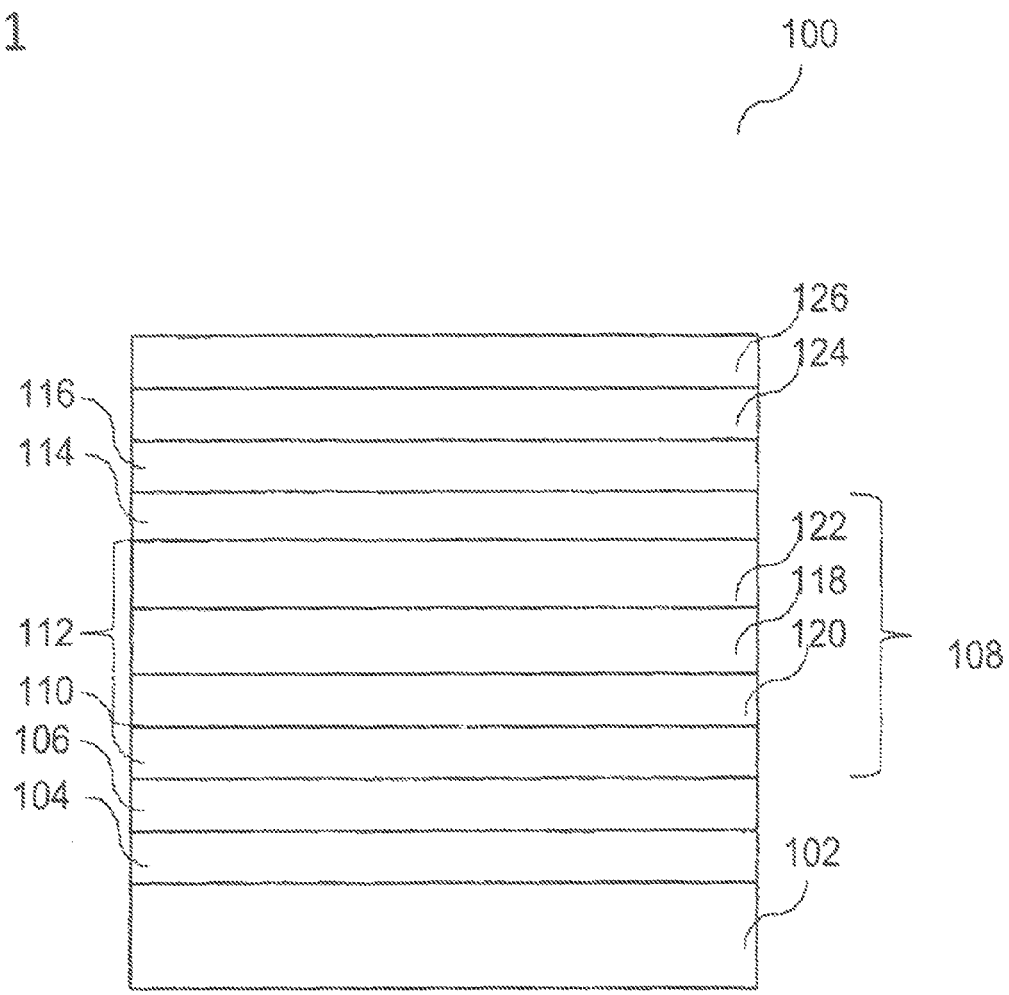
FIG. 1 shows a schematic cross-sectional view of an organic light-emitting diode according to various embodiments.

FIG. 1 shows a schematic cross-sectional view of an organic light-emitting diode 100 according to various embodiments.

The light-emitting component 100 in the form of an organic light emitting diode 100 may include a carrier 102. The carrier 102 may for example be used as a carrier element for electronic elements or layers, for example light-emitting elements. For example, the carrier 102 may be a glass (soft glass or hard glass, preferably soft glass), or a quartz glass.

Furthermore, the carrier 102 may include a plastic sheet or a laminate of one or more plastic sheets. The carrier 102 may be configured so as to be translucent or even transparent.

In various embodiments, the term "translucent" or "translucent layer" may be understood as meaning that a layer is transmissive for light, for example for the light generated by the light-emitting component, for example of one or more wavelength ranges, for example for light in a wavelength range of visible light (for example at least in a subrange of the wavelength range of from 380 nm to 780 nm). For example, in various embodiments, the term "translucent layer" is to be understood as meaning that essentially the total amount of light input into a structure (for example a layer) is also output from the structure (for example layer), in which case a part of the light may be scattered in the process.

In various embodiments, the term "transparent" or "transparent layer" may be understood as meaning that a layer is transmissive for light (for example at least in a subrange of the wavelength range of from 380 nm to 780 nm), light input into a structure (for example a layer) also being output from the structure (for example layer) essentially without scattering or light conversion. In various embodiments, "transparent" is therefore to be regarded as a special case of "translucent".

For the case in which, for example, a light-emitting electronic component which is monochromatic or limited in its emission spectrum is intended to be provided, it is sufficient for the optically translucent layer structure to be translucent at least in a subrange of the wavelength range of the desired monochromatic light, or for the limited emission spectrum.

In various embodiments, the organic light-emitting diode 100 (or the light-emitting components according to the embodiments described above or below) may be configured as a so-called top and bottom emitter. A top and bottom emitter may also be referred to as an optically transparent component, for example a transparent organic light-emitting diode.

In various embodiments, a barrier layer 104 may optionally be arranged on or over the carrier 102. The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 may have a layer thickness in a range of from approximately 0.1 nm (one atomic layer) to approximately 5000 nm, for example a layer thickness in a range of from approximately 10 nm to approximately 200 nm, for example a layer thickness of approximately 40 nm.

Thus, in various embodiments, the scattering layer 106 may be applied on or over the barrier layer 104 (or, if the barrier layer 104 is absent, on or over the carrier 102).

In various embodiments, the scattering layer 106 may have a thickness of from approximately 1 µm to approximately 40 µm,
for example from approximately 1 µm to approximately 30 µm, for example from 3 µm to approximately 20 µm,
for example from 5 µm to approximately 15 µm.

Further specifications of the scattering layer 106 may be found from the description of FIG. 2, FIG. 3, FIG. 4 and FIG. 5.

In various embodiments, the first electrode 110 may be applied (for example in the form of a first electrode layer 110) on or over the scattering layer 104. The first electrode 110 (also referred to below as the lower electrode 110) may be formed from an electrically conductive material, for example a metal or a transparent conductive oxide (TCO), or a layer stack of a plurality of layers of the same metal or different metals and/or of the same TCO or different TCOs. Transparent conductive oxides are transparent conductive materials, for example metal oxides, for example zinc oxide, tin oxide, cadmium oxide, titanium oxide, indium oxide or indium tin oxide (ITO). Besides binary metal-oxygen compounds, for example ZnO, $SnO_2$, or $In_2O_3$, ternary metal-oxygen compounds, for example AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of various transparent conductive oxides also belong to the TCO group and may be used in various embodiments. Furthermore, the TCOs do not necessarily correspond to a stoichiometric composition, and may furthermore be p-doped or n-doped.

In various embodiments, the first electrode 110 may include a metal; for example Ag, Pt, Au, Mg, Al, Ba, In, Ag, Au, Mg, Ca, Sm or Li, as well as compounds, combinations or alloys of these materials.

In various embodiments, the first electrode 110 may be formed from a layer stack of a combination of a layer of a metal on a layer of a TCO, or vice versa. One example is a silver layer, which is applied on an indium tin oxide layer (ITO) (Ag on ITO) or ITO/Ag/ITO multilayers.

In various embodiments, the first electrode 110 may provide one or more of the following materials as an alternative or in addition to the materials mentioned above: networks of metal nanowires and nanoparticles, for example of Ag; networks of carbon nanotubes; graphene particles and graphene layers; networks of semiconducting nanowires.

Furthermore, the first electrode 110 may include electrically conductive polymers or transition metal oxides or electrically conductive transparent oxides.

In various embodiments, the first electrode 110 and the carrier 102 may be formed so as to be translucent or transparent. In the case in which the first electrode 110 is formed from a metal, the first electrode 110 may for example have a layer thickness less than or equal to approximately 25 nm, for example a layer thickness less than or equal to approximately 20 nm, for example a layer thickness less than or equal to approximately 18 nm. Furthermore, the first electrode 110 may for example have a layer thickness greater than or equal to approximately 10 nm, for example a layer thickness greater than or equal to approximately 15 nm. In various embodiments, the first electrode 110 may have a layer thickness in a range of from approximately 10 nm to approximately 25 nm, for example a layer thickness in a range of from approximately 10 nm to approximately 18 nm, for example a layer thickness in a range of from approximately 15 nm to approximately 18 nm.

Furthermore, for the case in which the first electrode 110 is formed from a conductive transparent oxide (TCO), the first electrode 110 may for example have a layer thickness in a range of from approximately 50 nm to approximately 500 nm, for example a layer thickness in a range of from approximately 75 nm to approximately 250 nm, for example a layer thickness in a range of from approximately 100 nm to approximately 150 nm.

Furthermore, for the case in which the first electrode 110 is formed for example from a network of metal nanowires, for example of Ag, which may be combined with conductive polymers, a network of carbon nanotubes, which may be combined with conductive polymers, or of graphene layers and composites, the first electrode 110 may for example have a layer thickness in a range of from approximately 1 nm to approximately 500 nm, for example a layer thickness in a range of from approximately 10 nm to approximately 400 nm, for example a layer thickness in a range of from approximately 40 nm to approximately 250 nm.

The first electrode 110 may be formed as an anode, i.e. as a hole-injecting electrode, or as a cathode, i.e. as an electron-injecting electrode.

The first electrode 110 may include a first electrical terminal, to which a first electrical potential (provided by an energy source (not represented), for example a current source or a voltage source) may be applied. As an alternative, the first electrical potential may be applied to the carrier 102 and then delivered indirectly via the latter to the first electrode 110. The first electrical potential may, for example, be ground potential or another predetermined reference potential.

Furthermore, the electrically active region 108 of the light-emitting component 100 may include an organic electroluminescent layer structure 112, or organically functional layer structure 112, which is applied on or over the first electrode 110.

The organic electroluminescent layer structure 112 may contain one or more emitter layers 118, for example including fluorescent and/or phosphorescent emitters, as well as one or more hole conduction layers 120 (also referred to as hole transport layer or layers 120). In various embodiments, as an alternative or in addition, one or more electron conduction layers 122 (also referred to as electron transport layer or layers 122) may be provided.

Examples of emitter materials which may be used in the light-emitting component 100 according to various embodiments for the emitter layer or layers 118 include organic or organometallic compounds, for example derivatives of polyfluorene, polythiophene and polyphenylene (for example 2- or 2,5-substituted poly-p-phenylene vinylene) and metal complexes, for example iridium complexes, for example blue phosphorescent FIrPic (bis(3,5-difluoro-2-(2-pyridyl)phenyl-(2-carboxypyridyl)-iridium III), green phosphorescent $Ir(ppy)_3$ (tris(2-phenylpyridine)iridium III), red phosphorescent $Ru(dtb-bpy)_3*2$ $(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyrane) as nonpolymeric emitters. Such nonpolymeric emitters may, for example, be deposited by means of thermal evaporation. Furthermore, polymeric emitters may be used, which may in particular be deposited by means of a wet chemical method, for example spin coating method.

The emitter materials may be embedded in a suitable way in a matrix material.

It should be pointed out that other suitable emitter materials are likewise provided in other embodiments.

The emitter materials of the emitter layer or layers 118 of the light-emitting component 100 may, for example, be selected in such a way that the light-emitting component 100 emits white light. The emitter layer or layers 118 may include a plurality of emitter materials emitting different colors (for example blue and yellow or blue, green and red); as an alternative, the emitter layer or layers 118 may also be constructed from a plurality of sublayers, for example a blue fluorescent emitter layer 118 or blue phosphorescent emitter layer 118, a green phosphorescent emitter layer 118 and a red phosphorescent emitter layer 118. Mixing of the different colors may lead to the emission of light with a white color impression. As an alternative, a converter material may also be arranged in the beam path of the primary emission generated by these layers, which material at least partially absorbs the primary radiation and emits secondary radiation with a different wavelength, so that a white color impression is obtained from (not yet white) primary radiation by the combination of primary and secondary radiation.

The organic electroluminescent layer structure 112 may in general include one or more electroluminescent layers. The one or more electroluminescent layers may include organic polymers, organic oligomers, organic monomers, nonpolymeric organic small molecules, or a combination of these materials. For example, the organic electroluminescent layer structure 112 may include one or more electroluminescent layers which is or are configured as a hole transport layer 120, so that, for example in the case of an OLED, effective hole injection into an electroluminescent layer or an electroluminescent region is made possible. As an alternative, in various embodiments, the organic electroluminescent layer structure 112 may include one or more functional layers which is or are configured as an electron transport layer 122, so that, for example in the case of an OLED, effective electron injection into an electroluminescent layer or an electroluminescent region is made possible. For example, tertiary amines, carbazol derivatives, conductive polyaniline or polyethylene dioxythiophene may be used as a material for the hole transport layer 120. In various embodiments, the one or more electroluminescent layers may be configured as an electroluminescent layer.

In various embodiments, the hole transport layer 120 may be applied, for example deposited, on or over the first electrode 110, and the emitter layer 118 may be applied, for example deposited, on or over the hole transport layer 120. In various embodiments, an electron transport layer 122 may be applied, for example deposited, on or over the emitter layer 118.

In various embodiments, the organic electroluminescent layer structure 112 (i.e. for example the sum of the thicknesses of hole transport layer or layers 120 and emitter layer or layers 118 and electron transport layer or layers 122) may have a layer thickness of at most approximately 1.5 µm, for example a layer thickness of at most approximately 1.2 µm, for example a layer thickness of at most approximately 1 µm, for example a layer thickness of at most approximately 800 nm, for example a layer thickness of at most approximately 500 nm, for example a layer thickness of at most approximately 400 nm, for example a layer thickness of at most approximately 300 nm. In various embodiments, the organic electroluminescent layer structure 112 may for example include a stack of a plurality of organic light-emitting diodes (OLEDs) that are arranged directly above one another, in which case each OLED may for example have a layer thickness of at most approximately 1.5 µm, for example a layer thickness of at most approximately 1.2 µm, for example a layer thickness of at most approximately 1 µm, for example a layer thickness of at most approximately 800 nm, for example a layer thickness of at most approximately 500 nm, for example a layer thickness of at most approximately 400 nm, for example a layer thickness of at most approximately 300 nm. In various embodiments, the organic electroluminescent layer structure 112 may for example include a stack of two, three or four OLEDs that are arranged directly above one another, in which case, for example, the organic electroluminescent layer structure 112 may for example have a layer thickness of at most approximately 3 µm.

The light-emitting component 100 may in general optionally include further organic functional layers, for example arranged on or over the one or more emitter layers 118 or on or over the electron transport layer or layers 122, which are used to further improve the functionality and therefore the efficiency of the light-emitting component 100.

The second electrode 114 may be applied (for example in the form of a second electrode layer 114) on or over the organic electroluminescent layer structure 112, or optionally on or over the one or the plurality of further organic functional layers.

In various embodiments, the second electrode 114 may include or be formed from the same materials as the first electrode 110, metals being particularly suitable in various embodiments.

In various embodiments, the second electrode 114 (for example for the case of a metallic second electrode 114) may for example have a layer thickness less than or equal to approximately 50 nm, for example a layer thickness less than or equal to approximately 45 nm, for example a layer thickness less than or equal to approximately 40 nm, for example a layer thickness less than or equal to approximately 35 nm, for example a layer thickness less than or equal to approximately 30 nm, for example a layer thickness less than or equal to approximately 25 nm, for example a layer thickness less than or equal to approximately 20 nm, for example a layer thickness less than or equal to approximately 15 nm, for example a layer thickness less than or equal to approximately 10 nm.

The second electrode 114 may in general be formed in a similar way as the first electrode 110, or differently thereto. The second electrode 114 may, in various embodiments, be formed from one or more of the materials and with the respective layer thickness described above in connection with the first electrode 110. In various embodiments, the first electrode 110 and the second electrode 114 are both formed so as to be translucent or transparent. The light-emitting component 100 represented in FIG. 1 may therefore be configured as a top and bottom emitter (expressed in another way, as a bidirectionally emitting light-emitting component 100).

The second electrode 114 may be configured as an anode, i.e. as a hole-injecting electrode, or as a cathode, i.e. as an electron-injecting electrode.

The second electrode 114 may include a second electrical terminal, to which a second electrical potential (which is different to the first electrical potential) provided by the energy source may be applied. The second electrical potential may, for example, have a value such that the difference from the first electrical potential has a value in a range of from approximately 1.5 V to approximately 20 V, for example a value in a range of from approximately 2.5 V to approximately 15 V, for example a value in a range of from approximately 3 V to approximately 12 V.

An encapsulation 116, for example in the form of a barrier thin film/thin-film encapsulation 116, may optionally also be formed on or over the second electrode 114, and therefore on or over the electrically active region 108.

In the scope of this application, a "barrier thin film" 116 may, for example, be understood as meaning a layer or a layer structure which is suitable for forming a barrier against chemical contaminants or atmospheric substances, in particular against water (moisture) and oxygen. In other words, the barrier thin film 116 is formed in such a way that it may not be penetrated, or may be penetrated at most in very small amounts, by substances that damage OLEDs, such as water, oxygen or solvent.

According to one configuration, the barrier thin film 116 may be formed as an individual layer (expressed another way, as a single layer). According to an alternative configuration, the barrier thin film 116 may include a multiplicity of sublayers arranged on top of one another. In other words, according to one configuration, the barrier thin film 116 may be formed as a layer stack. The barrier thin film 116, or one or more sublayers of the barrier thin film 116, may for example be formed by means of a suitable deposition method, for example by means of an atomic layer deposition (ALD) method according to one configuration, for example a plasma-enhanced atomic layer deposition (PEALD) method or a plasma-less atomic layer deposition (PLALD) method, or by means of a chemical vapor deposition (CVD) method according to another configuration, for example a plasma-enhanced chemical vapor deposition (PECVD) method or a plasma-less chemical vapor deposition (PL-CVD) method, or alternatively by means of other suitable deposition methods.

By using an atomic layer deposition (ALD) method, very thin layers may be deposited. In particular, layers whose layer thicknesses lie in the atomic layer range may be deposited.

According to one configuration, in the case of a barrier thin film 116 which includes a plurality of sublayers, all the sublayers may be formed by means of an atomic layer deposition method. A layer sequence which only includes ALD layers may also be referred to as a "nanolaminate".

According to an alternative configuration, in the case of a barrier thin film 116 which includes a plurality of sublayers, one or more sublayers of the barrier thin film 116 may be deposited by means of a deposition method other than an atomic layer deposition method, for example by means of a vapor deposition method.

The barrier thin film 116 may, according to one configuration, have a layer thickness of from approximately 0.1 nm (one atomic layer) to approximately 1000 nm, for example a layer thickness of from approximately 10 nm to approximately 100 nm according to one configuration, for example approximately 40 nm according to one configuration.

According to one configuration, in which the barrier thin film 116 includes a plurality of sublayers, all the sublayers may have the same layer thickness. According to another configuration, the individual sublayers of the barrier thin film 116 may have different layer thicknesses. In other words, at least one of the sublayers may have a different layer thickness than one or more others of the sublayers.

The barrier thin film 116, or the individual sublayers of the barrier thin film 116, may according to one configuration be formed as a translucent or transparent layer. In other words, the barrier thin film 116 (or the individual sublayers of the barrier thin film 116) may consist of a translucent or transparent material (or a material combination which is translucent or transparent).

According to one configuration, the barrier thin film 116, or (in the case of a layer stack including a multiplicity of sublayers) one or more of the sublayers of the barrier thin film 116, may include or consist of one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin film 116, or (in the case of a layer stack including a multiplicity of sublayers) one or more of the sublayers of the barrier thin film 116, may include one or more high-index materials, or expressed another way one or more materials having a high refractive index, for example having a refractive index of at least 2.

On or over the barrier thin film 116, an adhesive and/or a protective coating 124 may be provided, by means of which, for example, a cover 126 (for example a glass cover 126) is fastened, for example adhesively bonded, on the barrier thin film 116. In various embodiments, the optically translucent layer of adhesive and/or protective coating 124 may have a layer thickness of more than 1 µm, for example a layer thickness of several µm. In various embodiments, the adhesive may include or be a lamination adhesive.

In various embodiments, light-scattering particles, which may lead to a further improvement of the hue distortion and of the output efficiency, may also be embedded in the layer of adhesive (also referred to as the adhesive layer). In various embodiments, dielectric scattering particles may be provided as light-scattering particles, for example metal oxides, for example silicon oxide ($SiO_2$), zirconium oxide ($ZrO_2$), aluminum oxide or titanium oxide. Other particles may also be suitable, so long as they have a refractive index which is different than the effective refractive index of the matrix of the translucent layer structure, for example air bubbles, acrylate, or hollow glass spheres. Furthermore, for example, metal nanoparticles, metals such as gold or silver, iron nanoparticles, or the like, may be provided as light-scattering particles.

In various embodiments, an electrically insulating layer (not represented) may also be applied between the second electrode 114 and the layer of adhesive 124 and/or protective coating 124, for example a layer of SiN, for example with a layer thickness in a range of from approximately 300 nm to approximately 1.5 µm, for example with a layer thickness in a range of from approximately 500 nm to approximately 1 µm, in order to protect electrically unstable materials, for example during a wet chemical process.

In various embodiments, the adhesive may be configured so that it itself has a refractive index which is less than the refractive index of the cover 126.

Such an adhesive may for example be a low-index adhesive, for example an acrylate, which has a refractive index of approximately 1.3. Furthermore, a plurality of different adhesives, which form an adhesive layer sequence, may be provided.

Furthermore, it should be pointed out that, in various embodiments, an adhesive 124 may even be entirely obviated, for example in embodiments in which the cover 126, for example consisting of glass, is applied for example by means of plasma spraying onto the barrier layer 116.

In various embodiments, the cover 126 and/or the adhesive 124 may have a refractive index (for example at a wavelength of 633 nm) of 1.55.

Furthermore, in various embodiments one or more antireflection layers (for example combined with the encapsulation 116, for example the thin-film encapsulation 116) may additionally be provided in the light-emitting component 100.

Figure 2:
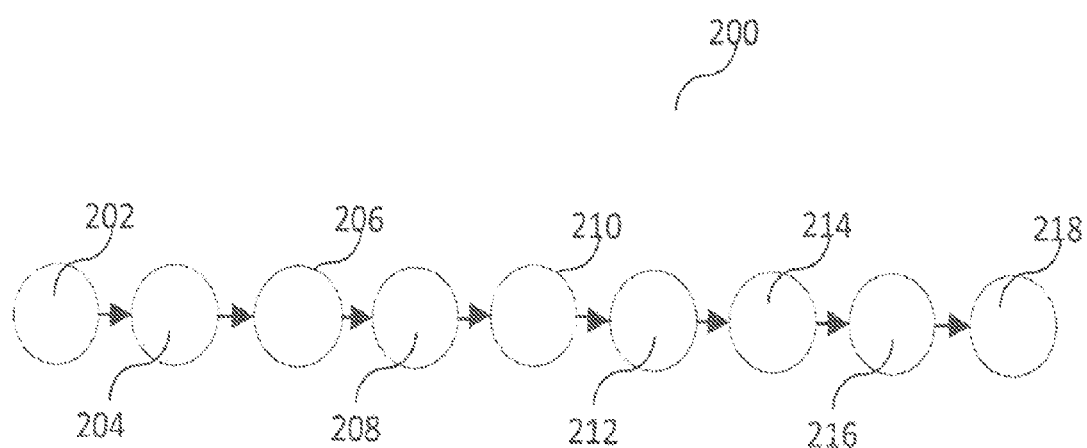
FIG. 2 shows a flow chart of the method for producing a scattering layer according to various embodiments.

FIG. 2 shows a flow chart 200 of the method for producing a scattering layer 106 according to various embodiments.

Represented are the preparation of the carrier 202, application of the scattering center precursor 204, drying of the scattering center precursor 206, application of the glass layer precursor 208, drying of the glass layer precursor 210, removal of nonvolatile organic constituents from the scattering center layer and the glass layer (debindering) 212, liquefying of the glass layer precursor 214, or liquefying (vitrifying) of the glass powder layer 214, solidification of the glass 216 and the adjustment of the surface properties 218, in which case the adjustment of the surface properties 218 may be optional.

The preparation 202 of the carrier, for example a soda-lime glass with a refractive index of approximately 1.5, may for example include the application of a barrier layer 104, for example $SiO_2$, cleaning of the surface of the carrier 102, or of the barrier layer 104, or adjustment of the surface roughness or chemical groups on the surface 302 of the carrier 102, or of the barrier layer 104.

After the preparation 202 of the carrier 102, the scattering center precursor 304 may be applied onto the surface 302 of the carrier 102, or of the barrier layer 104. The application of the scattering center precursor 204 may, for example, include application of a suspension or a paste of scattering centers 306 and volatile and nonvolatile organic constituents onto the surface 302.

In one configuration, which is not to be regarded as restrictive, a thin screen-printed layer 304, or scattering center precursor 304, may be formed with a wet layer thickness of, for example, approximately 30 µm from a screen-printable paste or suspension of oxidic scattering particles 306, for example KRONOS 2056 ($TiO_2$, $d_{50}$=0.45 µm) or CR10 ($Al_2O_3$, $d_{50}$=0.45 µm) and a commercially available screen-printing medium (for example nitrocellulose in ethyl acetate or cellulose derivatives in glycol ethers).

After application of the scattering center precursor 304 using volatile solvents, for example in a suspension or paste, drying 206 of the scattering center precursor 304 is carried out. The screen-printed layer 304 may, for example, be dried for 3 hours at 70° C. During drying 206 the volatile constituents of the screen-printed layer 304 are removed. However, the screen-printed layer 304 still includes nonvolatile organic constituents, such as the binder, which binds the scattering particles to one another and to the carrier and thereby imparts a certain mechanical strength to the layer for subsequent process steps.

After drying 206 of the screen-printed layer 304, a glass layer precursor 310 may be applied, for example by means of screen printing or template printing, for example using a glass powder suspension or glass powder paste, which may include a powder of lead borate glass particles or lead borosilicate glass particles. The glass powder suspension or glass powder paste likewise contains a commercially available screen-printing medium (for example nitrocellulose in ethyl acetate or cellulose derivatives in glycol ethers. The printed glass powder layer 310 may, for example, have a wet layer thickness of approximately 30 µm. The lead borate glass particles or lead borosilicate glass particles may, for example, have a refractive index in a range of from approximately 1.7 to approximately 1.9. The lead borate glass particles or the lead borosilicate glass particles may, for example, have a particle size distribution with a D90<12 µm and a D50<3 µm. The thermal expansion coefficient of the lead borate glass particles or of the lead borosilicate glass particles may, for example, be approximately $7.5 \cdot 10^{-6}$ 1/K for the temperature range of from approximately 50° C. to approximately 400° C., and the thermal expansion coefficient of the carrier, which includes soda-lime glass, may for example be approximately $8.5\text{-}9 \cdot 10^{-6}$ 1/K.

The thickness of the glass layer precursor 310 may be such that the total volume of the glass 312 in the glass layer precursor 310 is greater than the free volume between the scattering centers 306 and the volume of the volatile and nonvolatile organic substances, for example binders, solvents, or expressed another way greater than the total occupiable volume of the intermediate spaces 308 between the scattering centers 306 in the scattering center precursor 304.

After application 208 of the glass layer precursor 310, the method may include drying 210 of the glass layer precursor 310, for example at 70° C. for 3 hours, in order to remove volatile constituents.

After drying 210 of the glass layer precursor 310, the nonvolatile organic constituents in the dried screen-printed layer 304 and the dried glass layer precursor 310 may be thermally removed by means of removal of nonvolatile organic constituents 212, for example by means of pyrolysis. The screen-printing medium should therefore be selected in such a way that debindering is completed before the glass powder softens. Because the lead borosilicate glass used may start to soften beyond approximately 500° C., the two binder/solvent systems mentioned above are highly suitable for this glass, since they may already burn out between approximately 200° C. and approximately 400° C., depending on the system.

The removal of nonvolatile organic constituents 212 in the scattering center precursor 304 and the glass layer precursor 310 may form a free volume 308 in the scattering center precursor 304 and the glass layer precursor 310.

After removal of the nonvolatile organic constituents 212, the liquefying 214 of the glass layer precursor 310 may be carried out.

In the case of the aforementioned lead borosilicate glass solder as the glass powder layer 310, the vitrifying may be carried out at temperatures above approximately 500° C. In the example of a soda-lime glass as the carrier 102, with an upper cooling temperature of approximately 550° C., the upper temperature limit may have a value of approximately 600° C., depending on the heating method, in order to keep deformation of the carrier small, or to avoid it. During the vitrifying, the viscosity of the glass layer precursor 310, or of the glass particles 312, is reduced. In this way, the glass layer precursor 310, or the glass particles 312, may occupy the free volume 308 between the scattering centers 306 of the dried screen-printed layer 304. This process is also referred to as vitrifying. If the vitrifying takes place below the transformation temperature of the carrier 102, or of the carrier glass 102, then no thermal stresses are formed therein. The thermal expansion coefficient of the two bonding partners, i.e. the carrier 102 and the glass solder 312, should not differ too greatly in order to avoid excessive bonding stresses between the carrier 312 and the scattering layer 106, and thereby ensure a durable connection. Since the scattering layer 106 may act in a similar way to a barrier layer, a barrier thin film 104 may be obviated, for example when the glass matrix 312 does not contain alkali metals.

By means of the vitrifying, the thickness may be reduced in relation to the thickness of the screen-printed layer 304 or of the scattering center precursor 304, and the layer thickness of the glass layer precursor 310, for example to a thickness of approximately 10 µm. By means of this configuration, the light output may be increased significantly. Free volume 308 not occupiable by the liquefied glass, so-called cavities 410, may form further scattering centers 410 in the glass matrix 408, or the glass layer 408, in addition to the scattering centers 306.

After the glass layer precursor 214 has been liquefied and the liquefied glass has flowed into the space 308 between the scattering centers 306, solidification 216 of the glass 408 may be carried out, for example by means of cooling, for example passively cooled. By means of the solidification 216 of the glass 408, the scattering layer 106 may be formed.

After the solidification 216 of the scattering layer 106, adjustment of the surface property 216 of the scattering layer 106 may be carried out, for example polishing, i.e. smoothing of the surface 502 of the scattering layer 106, for example by means of brief local raising of the temperature, for example by means of directed plasma, for example as fire polishing or also as laser polishing.

In another configuration, lead borate glass particles or lead borosilicate glass particles, which have for example a particle size distribution with a D90<15 μm and a D50<6 μm, may be used for the glass layer precursor 310. The lead borate glass particles or lead borosilicate glass particles may have a thermal expansion coefficient of, for example, approximately $12.5 \cdot 10^{-6}$ 1/K. When this glass is used, the vitrifying may be formed at temperatures below approximately 500° C., since its softening may begin at approximately 360° C.

In another configuration, lead-free glass particles, which may have a refractive index of for example between approximately 1.7 and approximately 2.1, may also be used for the glass layer precursor 310. These may for example be bismuth borate glass particles or bismuth borosilicate glass particles, with a particle size distribution D50 of approximately 1 μm and a thermal expansion coefficient of approximately $8.5 \cdot 10^{-6}$ 1/K for the temperature range of from approximately 50° C. to approximately 350° C. As an alternative, for example, bismuth zinc borate glass particles or bismuth zinc borosilicate glass particles with a particle size distribution D50 of approximately 7 μm and a thermal expansion coefficient of approximately $10 \cdot 10^{-6}$ 1/K for the temperature range of from approximately 50° C. to approximately 300° C. may also be selected.

Figure 3:
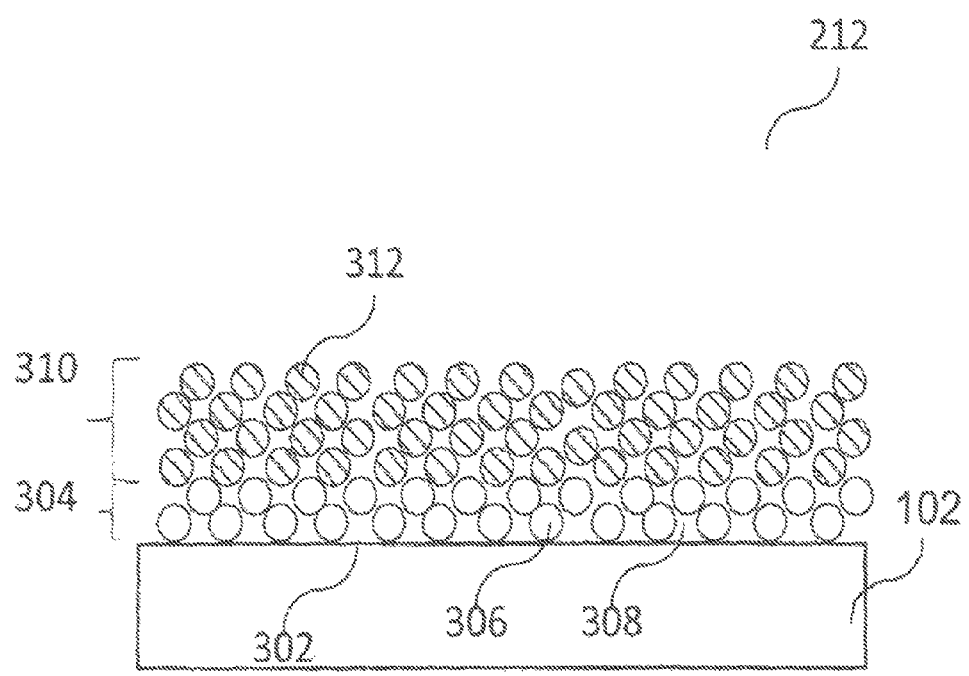
FIG. 3 shows a schematic cross-sectional view of the scattering layer in the method for producing a scattering layer according to various embodiments.

FIG. 3 shows a schematic cross-sectional view of the scattering layer 106 in the method for producing a scattering layer 200 according to various embodiments, after removal of nonvolatile organic constituents 212 of the glass layer precursor 310 including glass particles 312, and the scattering center precursor 304 including scattering centers 306 on the surface 302 of the carrier 102, or of the barrier layer 104. By removal of nonvolatile organic constituents of the scattering center precursor 304 and of the glass layer precursor 310, a free volume 308 may be formed between the scattering centers 306 and between the glass particles 312. The precursor layers 304, 310 in this case describe the applied layers of the scattering centers 306 and glass particles 312 with or without volatile and/or nonvolatile organic constituents.

Figure 4:
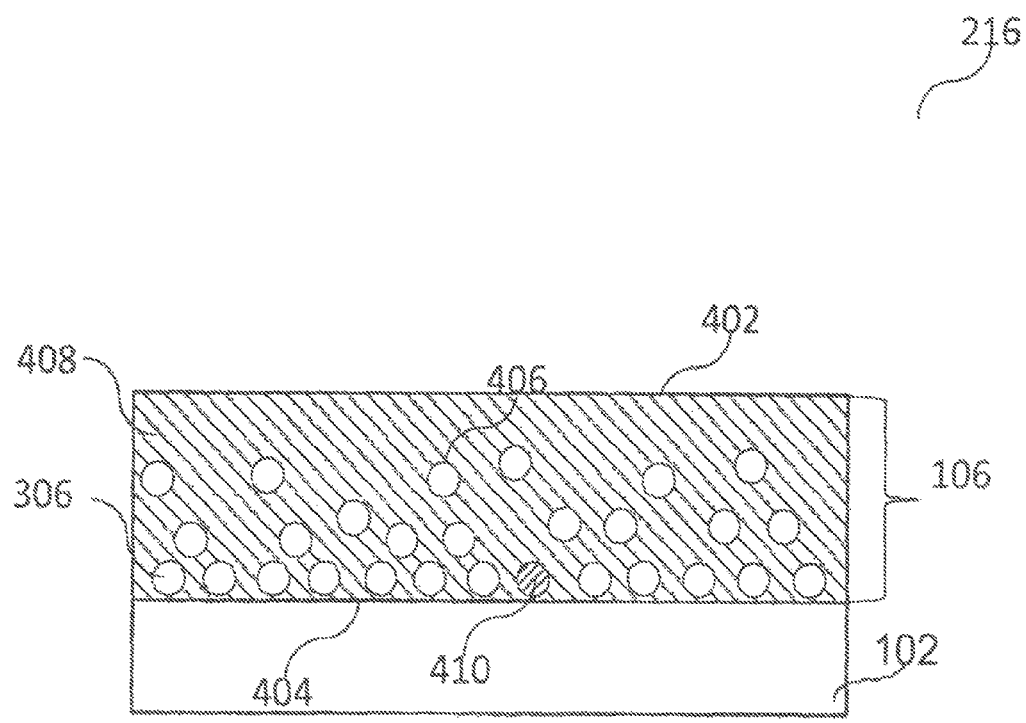
FIG. 4 shows a schematic cross-sectional view of the scattering layer in the method for producing a scattering layer according to various embodiments.

FIG. 4 shows a schematic cross-sectional view of the scattering layer 106 in the method for producing a scattering layer 200 according to various embodiments, after the glass 312 has been liquefied 212 and has flowed into the free volume 308 between the scattering centers 306.

The represented layer cross section of the scattering layer 106 corresponds, for example, to the layer cross section after solidification 216 of the liquefied glass particles 308 and the formation of the glass layer 408, or of the glass matrix 408. The glass 408 may have a free surface 402 and share a common interfaces 404 with the carrier 102, or the barrier layer 104. Furthermore, the glass layer 408 may share a common interface 406 or a plurality of common interfaces 406 with the scattering centers 306.

Besides the scattering centers 306, cavities 410 may also be formed in the glass matrix 408, for example by means of free volumes 308 not accessible for liquefied glass.

In various embodiments, a method is provided with which it is possible to produce scattering layers having an adjustable scattering cross section and a smooth surface with a single heat-treatment step. In particular, amorphous scattering layers made of high-index glasses without PbO may be produced with the method provided, and therefore contribute to the implementation of Directive 2002/95/EC in optoelectronic components. This method is highly suitable for scattering layers including lead-free glasses. In comparison with a scattering layer that has been produced from a homogeneous mixture of scattering particles and glass particles, this method allows a larger process window for amorphously solidifying the high-index glass matrix.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing a scattering layer for electromagnetic radiation, the method comprising in this order:
    applying scattering centers onto a surface of a carrier of an electronic element;
    applying glass onto the scattering centers; and
    liquefying of the glass so that a part of the liquefied glass flows between the scattering centers toward the surface of the carrier, in such a way that a part of the liquefied glass still remains above the scattering centers.

2. The method as claimed in claim 1,
    wherein the scattering centers have a curved surface.

3. The method as claimed in claim 1,
    wherein the scattering centers have an average particle size of from 0.1 μm to 3 μm.

4. The method as claimed in claim 1,
    wherein the scattering centers applied on the carrier form a layer with a thickness of from 0.1 μm to 10 μm.

5. The method as claimed in claim 1,
    wherein the glass has a refractive index greater than 1.7.

6. The method as claimed in claim 1,
    wherein the glass on or over the scattering centers has a substance or substance mixture with a refractive index greater than or equal to the layer thickness-weighted refractive index of further layers in the layer cross section of the electronic element that is formed on the scattering layer.

7. The method as claimed in claim 1,
    wherein the scattering layer has a difference greater than 0.05 between the refractive index of the scattering centers and the refractive index of the glass after solidification of the glass.

8. The method as claimed in claim 1,
    wherein, when a soda-lime glass is used as the carrier, the glass powder is vitrified at temperatures of up to at most 600° C.

9. The method as claimed in claim 1, wherein the scattering layer is applied on the carrier with a thickness of from 1 μm to 40 μm.

10. The method as claimed in claim 1,
    wherein the scattering centers are applied on or over the carrier from a scattering center suspension or scattering center paste.

11. The method as claimed in claim 10,
    wherein the scattering center suspension on or over the carrier is dried by means of constituents that evaporate.

12. The method as claimed in claim 1,
wherein the glass is applied in particles as glass powder onto the scattering centers.

13. The method as claimed in claim 12,
wherein the glass particles have a diameter of from 0.1 μm to 30 μm.

14. The method as claimed in claim 1,
wherein the concentration by volume of scattering centers decreases from the surface of the carrier.

15. The method as claimed in claim 1, liquefying of the glass further comprising:
wherein the glass is liquefied such that:
an interface of the carrier with the scattering layer has a concentration of the matrix greater than 0% by volume; and
the surface of the scattering layer has a concentration of the matrix of 100% by volume and
the matrix of the scattering layer has at least one continuous connection without gaps from the surface of the carrier to the surface of the scattering layer,
wherein the part of the scattering layer above the scattering centers has a thickness equal to or greater than the roughness of the uppermost layer of the scattering centers without matrix.

16. The method as claimed in one of claim 1, liquefying of the glass further comprising:
wherein the glass is liquefied such that:
an interface of the carrier with the scattering layer has a concentration of the matrix greater than 0% by volume; and
the surface of the scattering layer has a concentration of the matrix of 100% by volume and
the matrix of the scattering layer has at least one continuous connection without gaps from the surface of the carrier to the surface of the scattering layer,
wherein the part of the scattering layer above the scattering centers has a thickness such that the surface has a rms roughness of less than 10 nm.

17. The method as claimed in one of claim 1, further comprising:
solidifying the glass and forming a transparent electrode on the glass.

\* \* \* \* \*